(12) United States Patent
Han

(10) Patent No.: US 7,344,911 B2
(45) Date of Patent: Mar. 18, 2008

(54) CMOS IMAGE SENSOR AND METHOD FOR FABRICATING THE SAME

(75) Inventor: Chang Hun Han, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 195 days.

(21) Appl. No.: 11/319,585

(22) Filed: Dec. 29, 2005

(65) Prior Publication Data

US 2006/0145280 A1    Jul. 6, 2006

(30) Foreign Application Priority Data

Dec. 30, 2004  (KR) .................... 10-2004-0116519

(51) Int. Cl.
*H01L 21/00* (2006.01)
(52) U.S. Cl. .......................... 438/59; 438/70
(58) Field of Classification Search ............ 438/59–60, 438/70–76
See application file for complete search history.

(56) References Cited

U.S. PATENT DOCUMENTS 6,706,550 B2 *  3/2004  Lee et al. ..................... 438/57
6,872,975 B2 *  3/2005  Murade ....................... 438/70

FOREIGN PATENT DOCUMENTS

KR    10-2004-0059942 A    7/2004

* cited by examiner

*Primary Examiner*—Cuong Nguyen
(74) *Attorney, Agent, or Firm*—McKenna Long & Aldridge LLP

(57) ABSTRACT

A CMOS image sensor and a method for fabricating the same are provided, in which an N type region of a photodiode is prevented from adjoining a device isolation film and a dark current is reduced. The CMOS image sensor includes an interlayer dielectric film formed between a gate poly and a power line, a contact formed in the interlayer dielectric film, and an epitaxial layer connected with the contact and formed only in a blue photodiode region.

4 Claims, 4 Drawing Sheets

CMOS IMAGE SENSOR AND METHOD FOR FABRICATING THE SAME

This application claims the benefit of Korean Patent Application No. 10-2004-0116519, filed on Dec. 30, 2004, which is hereby incorporated by reference for all purposes as if fully set forth herein.

BACKGROUND OF THE INVENTION

1. Field of the Invention

The present invention relates to complementary metal-oxide-semiconductor (CMOS) image sensors, and more particularly, to a CMOS image sensor and a method for fabricating the same, which improves color reproduction by preventing an N type region of a photodiode from adjoining a device isolation film. The CMOS image sensor and the method for fabricating the same also reduces dark current.

2. Discussion of the Related Art

An image sensor is a semiconductor device that converts optical images to electrical signals. The image sensor is classified into a charge-coupled device (CCD) and a CMOS image sensor. The CCD stores charge carriers in MOS capacitors and transfers the charge carriers to the MOS capacitors. The MOS capacitors are approximate to one another. The CMOS image sensor employs a switching mode that sequentially detects outputs of unit pixels using MOS transistors by forming the MOS transistors to correspond to the number of the unit pixels using CMOS technology that uses a control circuit and a signal processing circuit as peripheral circuits.

The CCD has drawbacks in that its driving mode is complicated, power consumption is high, and process steps are complicated due to many mask process steps. Also, it is difficult to integrate signal processing circuits in one chip of the CCD. To solve such drawbacks, a CMOS image sensor based on a method for manufacturing a sub-micron CMOS has been developed.

To display images, the CMOS image sensor sequentially detects signals in a switching mode by forming a photodiode and a MOS transistor in a unit pixel. Also, since the CMOS image sensor uses the CMOS technology, low power consumption is required. Furthermore, the number of masks required is less than the number of masks required for the CCD. For example, the number of masks for a CMOS image sensor is fewer by twenty than the thirty to forty masks required for the CCD. In this way, in the CMOS image sensor, process steps are simplified and various signal processing circuits can be integrated in one chip. Therefore, the CMOS image sensor has received much attention as an image sensor for next generation. The CMOS image sensor is widely used in digital still cameras, PC cameras, mobile cameras, etc.

FIG. 1 is a circuit diagram illustrating a unit pixel of a related art CMOS image sensor. As shown in FIG. 1, the unit pixel of the CMOS image sensor includes a photodiode (PD) 10 and four NMOS transistors. A ground GND is shown. The four NMOS transistors are comprised of a transfer gate (Tx) 30 transferring optical charges collected in the photodiode 10 to a floating diffusion (FD) region 20, a reset gate (Rx) 40 resetting the floating diffusion region 20 by setting the potential of the floating diffusion region 20 at a desired value and discharging the charges, a drive gate (Dx) 50 serving as a source follower buffer amplifier, and a selection gate (Sx) 60 serving as an addresser. A load transistor $V_b$ is formed to allow an output signal to be read outside the unit pixel. Power ($V_{DD}$) is applied.

FIG. 2 is a sectional view illustrating a layout of the related art CMOS image sensor. As shown in FIG. 2, a pnp type photodiode is provided with a p type epitaxial layer grown on a p+ type substrate. A device isolation film Fox is also provided. An n– type region 70 is formed in the p type epitaxial layer, and a $P^0$ type region 80 is formed on the n– type region 70 and a surface of the p type epitaxial layer.

A reverse bias is applied between the n– type region 70 and the p type region ($P^0$ type region 80 and p type epitaxial layer) so that the n– type region 70 is fully depleted when an impurity ion of the n– type region 70 is properly mixed with an impurity ion of the p type region. Thus, the depletion region is enlarged to the p type epitaxial layer below the n– type region 70 and the $P^0$ type region 80 on the n– type region 70. The depletion region is more abundantly enlarged to the p type epitaxial layer having a relatively low dopant concentration. The depletion region is used for image reproduction because optical charges generated by incident light can be accumulated and stored in the depletion region.

FIG. 3 illustrates absorption coefficient and penetration depth depending on the wavelength of incident light for the related art photodiode. As shown in FIG. 3, in accordance with the increase of wavelength of the incident light to the photodiode, the absorption coefficient decreases constantly while the penetration depth increases constantly. In a related art pixel structure, a blue wavelength has a penetration depth of 0.3 µm and causes a difficulty in the color reproduction of images. By contrast, a red light has a penetration depth of 10 µm. Thus, it is difficult to reproduce respective colors at a ratio of 1:1 in color reproduction using red, green, and blue colors. The failure in obtaining an ideal ratio of 1:1:1 of the respective colors in color reproduction reduces color reproduction.

FIG. 4 illustrates a penetration depth in a related art silicon substrate depending on the wavelength of incident light to the silicon substrate. As shown in FIG. 4, the penetration depth is marked by percentage. A main penetration region of a red light having a wavelength of 700 nm has a penetration depth of 4000 Å to 15000 Å. By contrast, main penetration regions of a blue light and a green light have a penetration depth less than 4000 Å.

SUMMARY OF THE INVENTION

Accordingly, the present invention is directed to a CMOS image sensor and method for fabricating the same that substantially obviates one or more problems due to limitations and disadvantages of the related art.

An advantage of the present invention is to provide a CMOS image sensor and method for fabricating the same, in which an N type region of a photodiode is prevented from adjoining a device isolation film.

Another advantage of the present invention is to provide a CMOS image sensor and method for fabricating the same, in which a dark current is reduced.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages in accordance with the purpose of the present invention, as embodied and broadly described, there is provided a CMOS image sensor comprising an interlayer dielectric film formed between a gate poly and a power line; a contact formed in the interlayer dielectric film; and an epitaxial layer connected with the contact and formed only in a blue photodiode region.

In another aspect of the present invention, there is provided a method for manufacturing a CMOS image sensor. The method comprising forming an interlayer dielectric film between a gate poly and a power line; forming a contact in the interlayer dielectric film; forming an epitaxial layer connected with the contact; and allowing the epitaxial layer to remain in a blue photodiode region having a low wavelength and removing the epitaxial layer in a region other than the blue photodiode region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
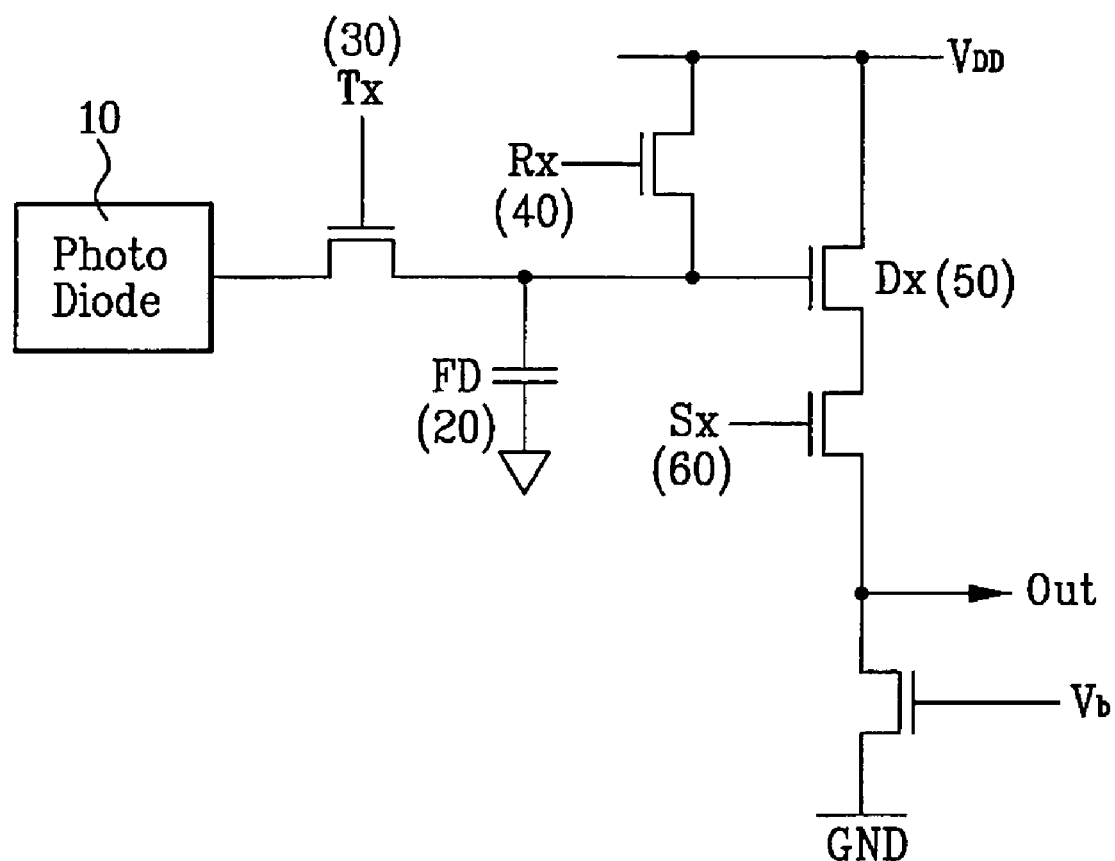
FIG. 1 is a circuit diagram illustrating a unit pixel of a related art CMOS image sensor.
Figure 2:
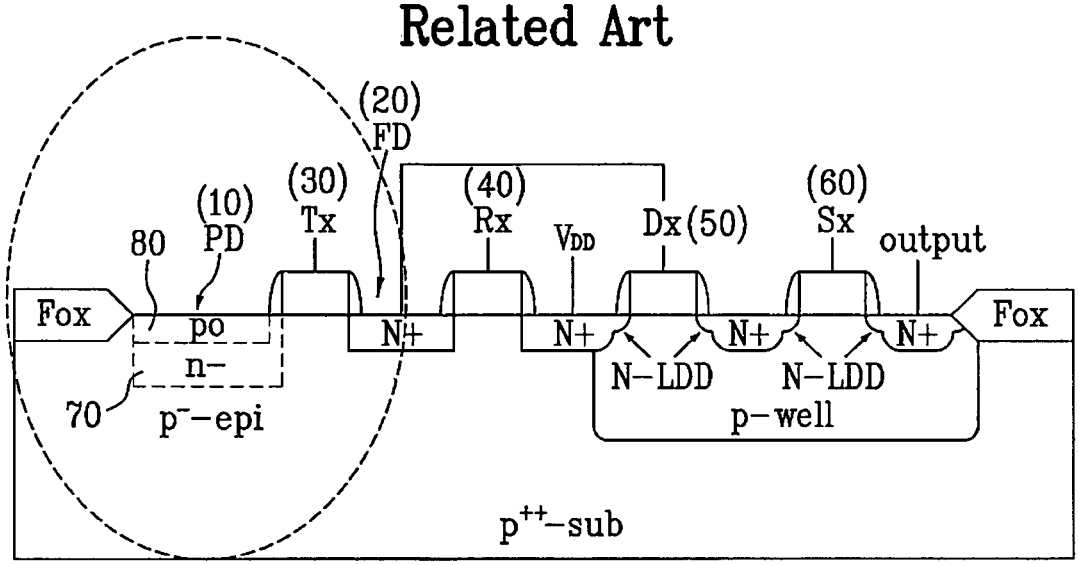
FIG. 2 is a sectional view illustrating a layout of a related art CMOS image sensor.
Figure 3:
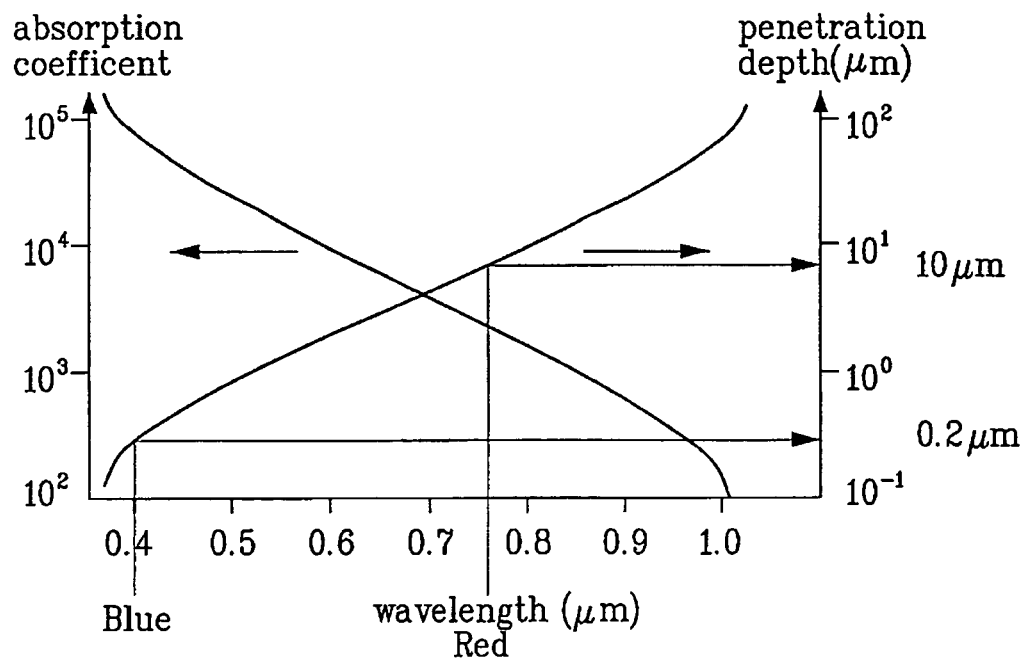
FIG. 3 illustrates absorption coefficient and penetration depth depending on the wavelength of incident light for a related art photodiode.
Figure 4:
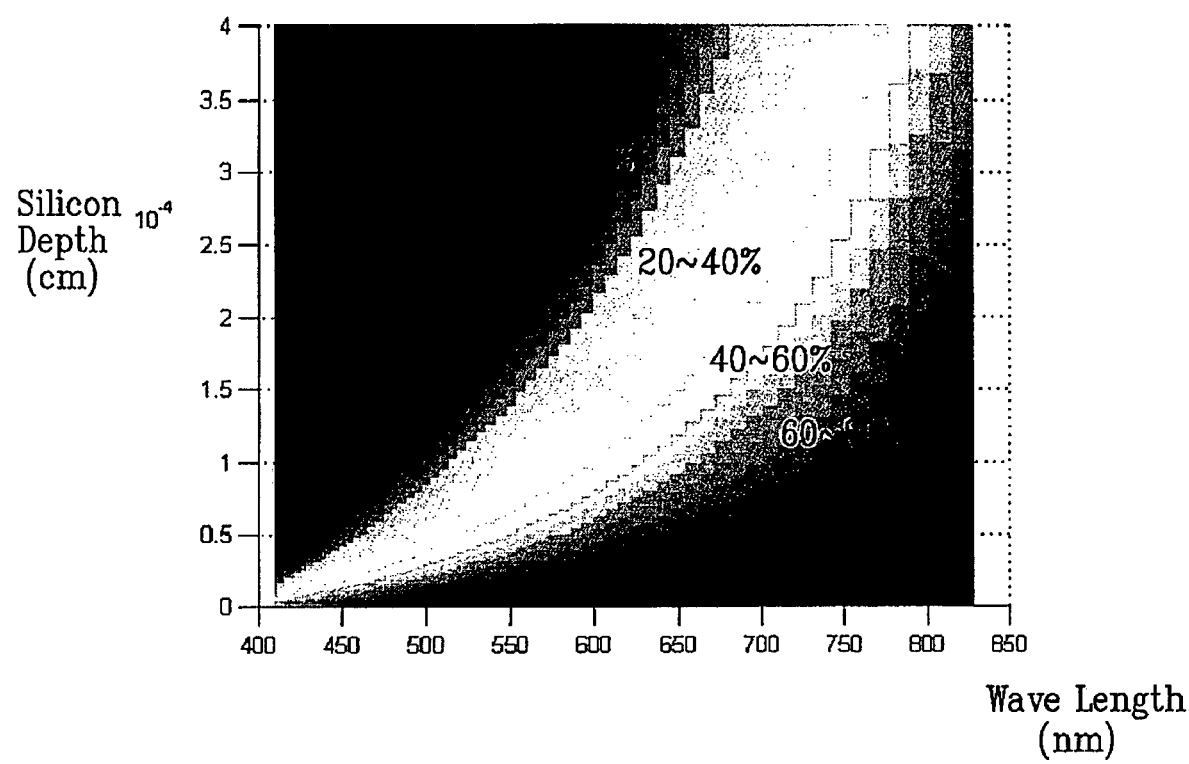
FIG. 4 illustrates a penetration depth in a related art silicon substrate depending on the wavelength of incident light to the silicon substrate.
Figure 5:
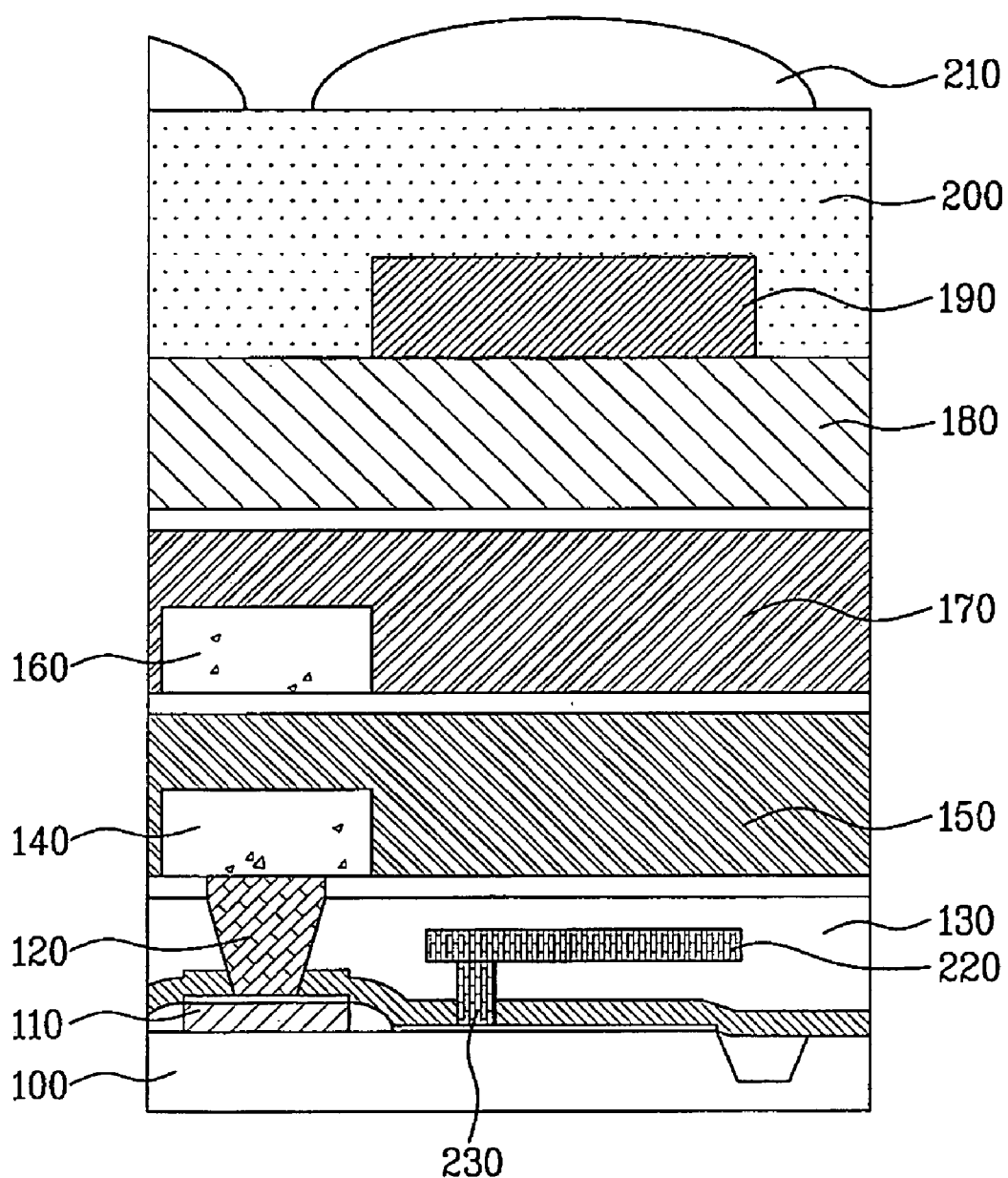
FIG. 5 is a cross-sectional view of a CMOS image sensor according to the present invention.

As shown in FIG. 5, illustrating a CMOS image sensor according to the present invention, a photodiode 100 is formed, and a power line layer 110 is formed on the photodiode 100. A gate poly 120 is connected between the power line layer 110 and a first metal layer 140. An interlayer dielectric film 130 is formed between the photodiode 100 and the first metal layer 140. The first metal layer 140 and a second metal layer 160 are sequentially deposited on the interlayer dielectric film 130. A first inter-metal dielectric layer 150 insulates the first metal layer 140 from the second metal layer 160. A second inter-metal dielectric layer 170 is formed on the second metal layer 160. The second inter-metal dielectric layer 170 insulates the second metal layer 160 from a nitride layer 180 deposited on the second inter-metal dielectric layer 170. A color filter array 190 is deposited on the nitride layer 180. A planarization layer 200 is deposited on the color filter array 190. As an example, a blue color filter array is used as the color filter array 190 because the photodiode is described based on a blue photodiode region. Further, a microlens 210 is deposited on the planarization layer 200.

A method for fabricating the CMOS image sensor of the present invention will now be described.

First, the interlayer dielectric film 130 is formed between the gate poly 120 and the power line layer 110.

A contact 230 connected with an N type epitaxial layer 220 is formed, and the N type epitaxial layer 220 is formed to have a thickness of 300 Å to 500Å. As an example, the N type epitaxial layer 220 has a thickness of 400 Å.

The epitaxial layer 220 remains in the blue photodiode region corresponding to a low wavelength region. The epitaxial layer 220 is removed in a region other than the blue photodiode region. That is, the blue photodiode region is formed in a range corresponding to a width of the color filter array 190. Therefore, the epitaxial layer 220 is made to have the same width as the color filter array 190 and is removed in a region other than the width of the color filter array 190, that is where the color filter array 190 does not exist. The area outside of the width of the color filter array 190 does not correspond to the blue photodiode region. Thus, the epitaxial layer 220 remains in the blue photodiode region. Unlike the related art photodiode that uses a silicon substrate as a sensitive layer of a blue light having a low wavelength, in the present invention, photosensitivity is improved by using the epitaxial layer 220 as the sensitive layer of the blue light.

The CMOS image sensor manufactured as above is constructed as follows. The interlayer dielectric film 130 is formed between the gate poly 120 and the power line 110. The contact 230 is formed in the interlayer dielectric film 130 and connected with the epitaxial layer 220. Also, the epitaxial layer 220 remains only in the blue photodiode region.

As described above, in the present invention, when an N type region of the photodiode is formed, a mask oxide is used to prevent the N type region of the photodiode from adjoining a device isolation film, thereby reducing a dark current. Also, to heavily dope the device, ions are implanted into a device isolation film and the N type region of the photodiode at a specific angle to further reduce the dark current, thereby improving characteristics of the CMOS image sensor.

Unlike the related art photodiode, in the present invention, the N type epitaxial layer, not a silicon substrate, is used as the sensitive layer of the blue light having the low wavelength to improve photosensitivity. The photodiode region is enlarged because a portion above the device isolation film is used as the sensitive area of the blue light. Also, since the N type epitaxial layer is formed to be higher than the related art silicon substrate, the depth of a focus becomes low to effectively collect the light.

As described above, the CMOS image sensor and the method of fabricating the same improves color reproduction. The CMOS image sensor and the method of fabricating the same has an improved resolution by improving reproduction of the blue light having the low wavelength.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a CMOS image sensor, comprising:
    forming an interlayer dielectric film between a gate poly and a power line;
    forming a contact in the interlayer dielectric film;

forming an epitaxial layer connected with the contact; and allowing the epitaxial layer to remain in a blue photodiode region having a low wavelength and removing the epitaxial layer in a region other than the blue photodiode region.

2. The method of claim 1, wherein the epitaxial layer has a thickness of 300 Å to 500 Å.

3. The method of claim 1, wherein the epitaxial layer is an N type epitaxial layer.

4. The method of claim 1, wherein the epitaxial layer is the same width as a color filter array.

\* \* \* \* \*